United States Patent

Choi

Patent Number: 5,770,336
Date of Patent: Jun. 23, 1998

[54] LITHOGRAPHY MASK AND FABRICATION METHOD THEREOF

[75] Inventor: Yong-Kyoo Choi, Chungcheongbuk-do, Rep. of Korea

[73] Assignee: LG Semicon Co., Ltd, Chungcheongbuk-do, Rep. of Korea

[21] Appl. No.: 794,348

[22] Filed: Feb. 3, 1997

[30] Foreign Application Priority Data

Jul. 31, 1996 [KR] Rep. of Korea ................... 31660/1996

[51] Int. Cl.$^6$ .................................................. G03F 9/00
[52] U.S. Cl. ............................................... 430/5; 430/314
[58] Field of Search .............................. 430/5, 311, 312, 430/313, 314

[56] References Cited

U.S. PATENT DOCUMENTS

| | | | |
|---|---|---|---|
| 5,217,830 | 6/1993 | Lowrey | 430/5 |
| 5,480,747 | 1/1996 | Vasudev | 430/5 |
| 5,691,089 | 11/1997 | Smayling | 257/49 |

*Primary Examiner*—S. Rosasco

[57] ABSTRACT

A lithography mask and a method for fabricating a mask are disclosed. The method includes the steps of forming a plurality of insulating film patterns on a semiconductor substrate, forming a plurality of doped regions in the semiconductor substrate, forming a conductive layer on the doped regions and the insulating film patterns, and forming a plurality of passages through the semiconductor substrate. The lithography mask includes a semiconductor substrate, a plurality of patterns formed on the semiconductor substrate, a plurality of doped regions formed in the semiconductor substrate between the patterns, a plurality of trenches formed on a lower portion of the semiconductor substrate to expose the doped regions, and a plurality of first holes each penetrating a corresponding one of the doped regions.

32 Claims, 7 Drawing Sheets

FIG.6a
FIG.6c
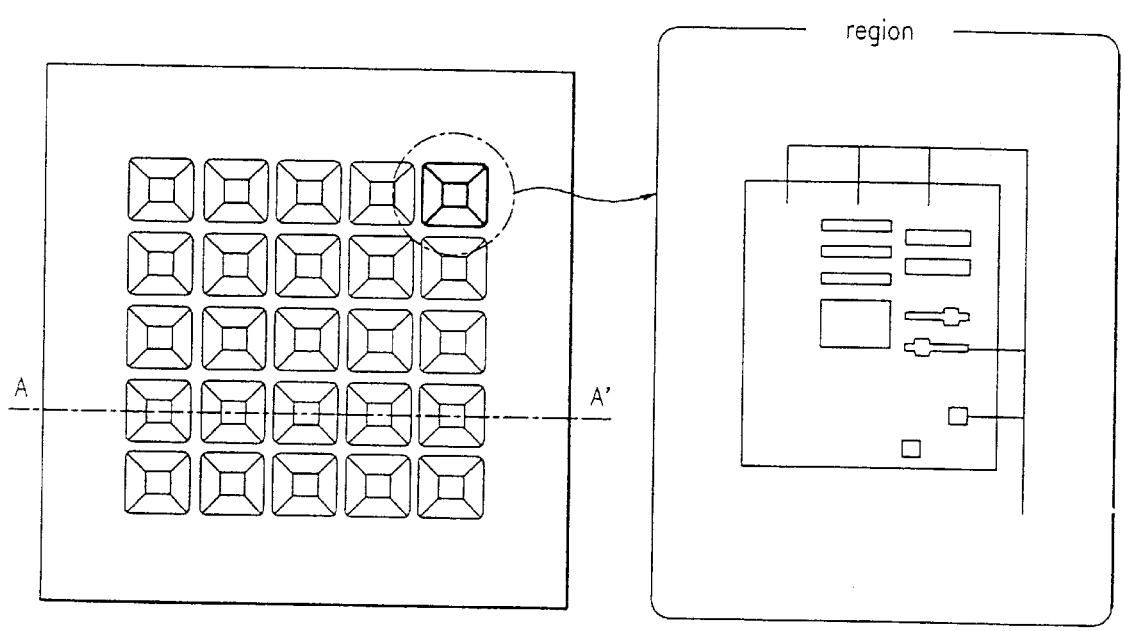
FIG.6b
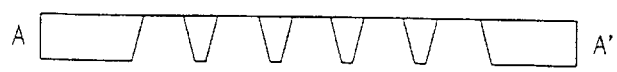

LITHOGRAPHY MASK AND FABRICATION METHOD THEREOF

BACKGROUND OF THE INVENTION

1. Field of the Invention

The present invention relates to lithography masks, and more particularly, to an E-beam mask suitable for fabricating a semiconductor device and a method for fabricating the E-beam mask.

2. Discussion of the Related Art

Generally, a masking process involves either the step of selectively removing the uppermost layer of a wafer or the step of forming a pattern on a layer or wafer. Masking involves transcription of a pattern from a mask to the surface of a wafer. Therefore, design and fabrication of a mask is an important process in the semiconductor fabrication process.

Masks are fabricated in general using a reticle technique or an E-Beam (Electron Beam) technique. In the reticle technique, a mask having a 2–3 micron pattern can be formed.

Describing the reticle technique, at first, a reticle for one chip is made by using a pattern generator (PG) tape having data of a design drawing recorded thereon. The reticle is basically a mother mask fabricated to a size 10 times of a regular chip size. By transferring the data of the design drawing transcribed on the reticle to a mask, the master mask is provided. For fabricating many chips on the wafer, there are a plurality of reticles for respective chip patterns formed on a sheet of mask. However, this reticle technique has drawbacks in that it requires a long time to fabricate one mask and the fabrication process is complicated.

Accordingly, the E-beam technique is often used instead of the reticle technique. The E-beam technique is used in fabricating photomasks where pattern size falls in the sub-micron range. The E-beam technique is convenient because it can directly fabricate the mask without the use of reticles.

FIG. 1 illustrates schematically a conventional electron beam exposing device. Referring to FIG. 1, the cell projection type electron beam exposing device includes an electron gun 1, two masks 2a and 2b, a deflector 3 and a magnetic electric lens 3'. The drawing shows enlarged views of the patterns formed on a wafer 4. The first mask 2a enhances coherency of an electron beam emitted from the electron gun 1, and the second mask 2b, being the master mask, has many patterns for forming microscopic patterns on the wafer 4.

The second mask 2b includes a silicon substrate etched for transmission of electron beams through the second mask 2b patterns. The patterns on the second mask 2b are in general more than 20 times greater in size than the actual pattern formed on the wafer 4. The size of these large patterns on the second mask 2b is reduced by the magnetic electric lens 3 before the patterns are projected onto the wafer 4. The second mask 2b, however, has disadvantages in that its fabrication process is complicated and expensive.

A conventional method for fabricating the master mask such as the second mask 2b will be explained with reference to the attached drawings. FIGS. 2a~2f illustrate sectional views showing steps of a conventional process for fabricating a master mask.

Referring to FIG. 2a, an SOI (silicon on insulator) wafer is provided, which has a first oxide film 11 formed on a silicon substrate 10 and a silicon film 12 formed on the first oxide film 11. As shown in FIG. 2b, a second oxide film 13 is formed on the silicon film 12 and patterned. As shown in FIG. 2c, the silicon film 12 is removed selectively to expose the first oxide film 11 using the patterned second oxide film 13 as a mask.

As shown in FIG. 2d, the patterned second oxide film 13 is removed and a nitride film 14 is formed on the surfaces of the silicon substrate 10 and the silicon film 12. The nitride film 14 on the back side (i.e., the bottom surface) of the silicon substrate 10 is patterned so that the back side nitride film 14 is aligned with the patterns of the silicon film 12 formed on the front side of the silicon substrate 10. As shown in FIG. 2e, the silicon substrate 10 is selectively removed to expose the first oxide film 11 using the patterned nitride film 14 as a mask. Then, as shown in FIG. 2f, the remaining nitride film 14 is completely removed and the first oxide film 11 is selectively removed using the silicon film 12 as a mask.

However, the above and other conventional methods for fabricating the mask have the following problems.

First, fabrication cost of the mask based on an SOI wafer is high.

Second, the patterning process for etching the back side of the silicon substrate raises the process cost.

Third, electrons in the semiconductor material (silicon) manifest charging phenomenon (i.e., charging of electrons) due to the degradation in the silicon conductivity. As a result, the mask cannot be used for a long time.

SUMMARY OF THE INVENTION

Accordingly, the present invention is directed to a lithography mask and a method of fabricating the lithography mask that substantially obviate one or more of the problems due to limitations and disadvantages of the related art.

An object of the present invention is to provide a mask which can simplify its fabrication process and lower its fabrication cost.

Another object of the present invention is to provide a mask which can reduce the electron charging effect.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the lithography mask includes a semiconductor substrate, a plurality of patterns formed on the semiconductor substrate, a plurality of doped regions each formed in the semiconductor substrate between the patterns, a plurality of trenches formed on a back side of the semiconductor substrate to expose the doped regions, and a plurality of holes each penetrating a corresponding doped region.

In other aspect of the present invention, there is provided a method for fabricating a lithography mask including the steps of providing a semiconductor substrate, forming a plurality of film patterns spaced apart in predetermined intervals on the substrate, forming a plurality of doped regions in exposed surfaces of the substrate between the film patterns using the insulating film patterns as masks, forming a conductive layer on the entire exposed surfaces of the doped regions and the insulating film patterns, patterning the conductive layer and thereby forming a plurality of first microscopic holes, selectively removing the back side of the substrate for exposing portions of the doped regions, and selectively etching the doped regions and thereby forming a plurality of second microscopic holes at portions of the doped regions corresponding to the plurality of the first microscopic holes.

It is to be understood that both the foregoing general description and the following detailed description are exemplary and explanatory and are intended to provide further explanation of the invention as claimed.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Briefly described, the present invention is directed to a method for fabricating a mask, including the steps of forming a plurality of insulating film patterns on a semiconductor substrate; forming a plurality of doped regions in the semiconductor substrate; forming a conductive layer on the doped regions and the insulating film patterns; and forming a plurality of passages through the semiconductor substrate.

Furthermore, the present invention is directed to a lithography mask including a semiconductor substrate, a plurality of patterns formed on the semiconductor substrate, a plurality of doped regions formed in the semiconductor substrate between the patterns, a plurality of trenches formed on a lower portion of the semiconductor substrate to expose the doped regions, and a plurality of first holes formed in the doped regions, each hole penetrating a corresponding one of the doped regions.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings, wherein

FIG. 6a illustrates a plan view of a mask having a plurality of microscopic patterns according to the embodiments of the present invention;

FIG. 6b illustrates a sectional view along line A–A' of FIG. 6a; and

FIG. 6c illustrates an enlarged view of a microscopic pattern of FIG. 6a.

DETAILED DESCRIPTION OF THE PREFERRED EMBODIMENTS

Figure 1:
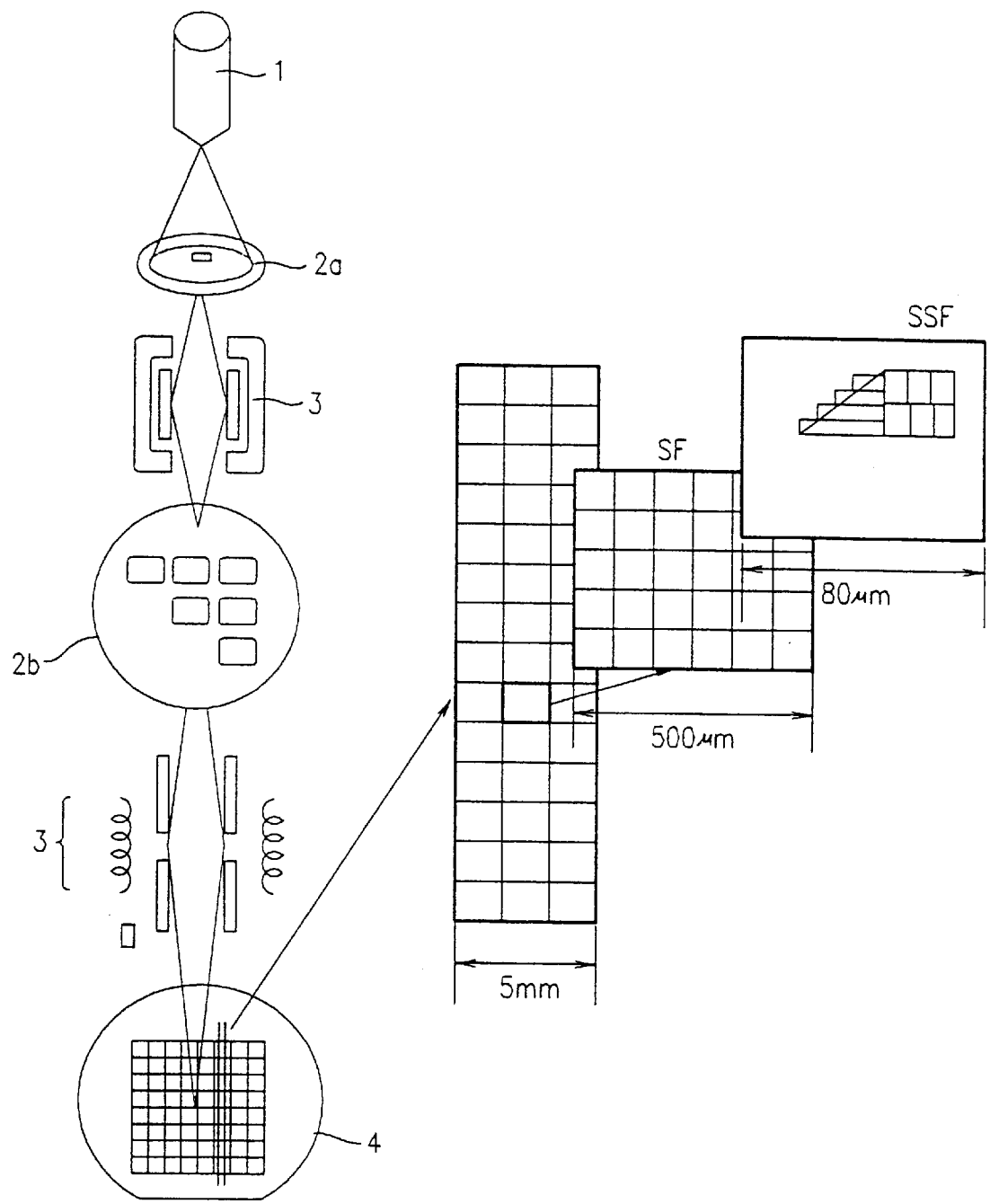
FIG. 1 illustrates schematically a conventional electron beam exposing device.
Figure 2A:
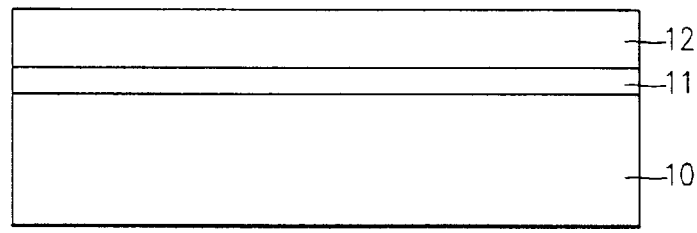
FIGS. 2a~2f illustrate sectional views showing fabrication steps of a conventional process for fabricating a mask.
Figure 2B:
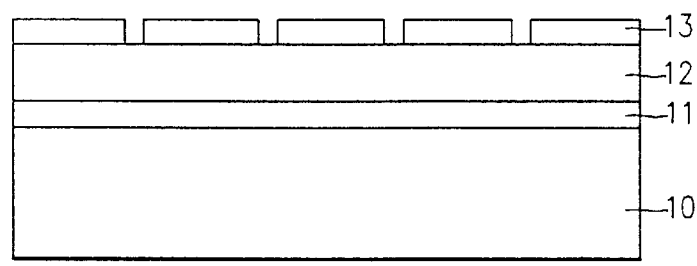
Figure 2C:
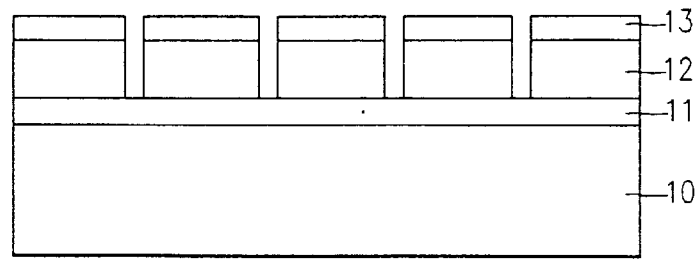
Figure 2D:
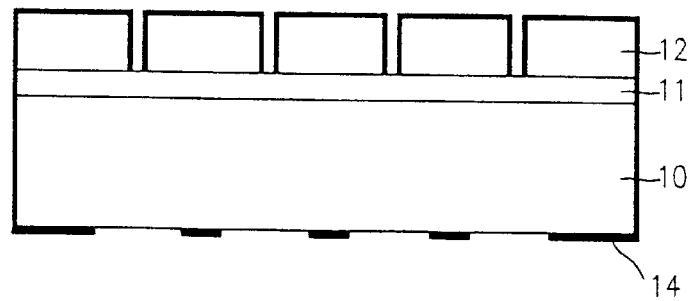
Figure 2E:
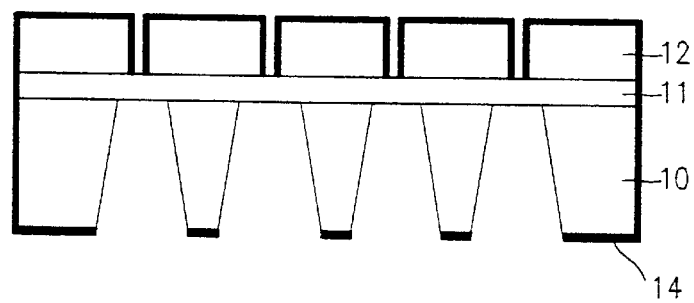
Figure 2F:
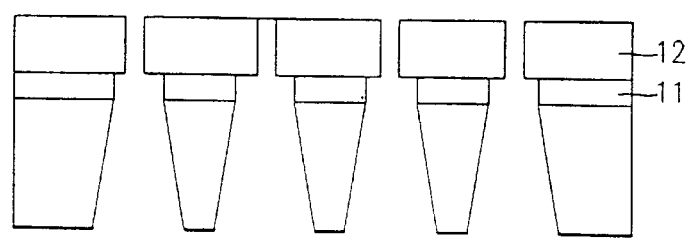
Figure 3:
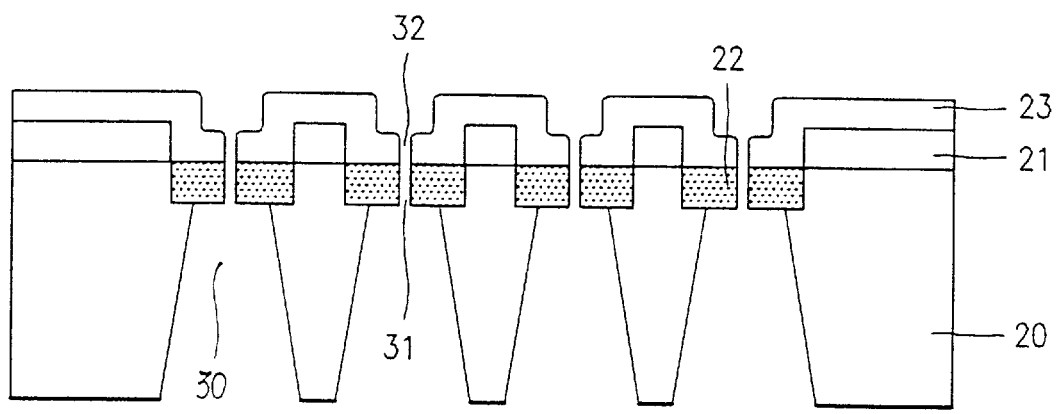
FIG. 3 illustrates a lithography mask in accordance with the embodiments of the present invention.

Reference will now be made in detail to the preferred embodiments of the present invention, examples of which are illustrated in the accompanying drawings. FIG. 3 illustrates a lithography mask in accordance with the embodiments of the present invention.

Referring to FIG. 3, the lithography mask of the present invention includes a silicon substrate 20 having a plurality of trenches 30 formed spaced apart in predetermined intervals on a back side (bottom surface) of the substrate 20, a plurality of oxide film patterns 21 formed on the substrate 20, a plurality of doped regions 22 formed in the top portion of the substrate and each doped region 22 having a penetrating hole 31 (or through-hole) connected to the corresponding trench 30, and a conductive layer 23 formed on the top surfaces of the oxide film patterns 21 and the doped regions 22.

The silicon substrate 20 is formed of an N conductive type or P conductive type material. Each of the doped regions 22 formed in the surface of the substrate 20 is doped to a depth of 10μm~30μm with a dopant selected from boron (B), phosphorus (P), and arsenic (As). The dopant used in this case has a conductivity type identical to the substrate 20's. The conductive layer 23 is formed of either a refractory metal, such as tungsten (W), aluminum (Al) platinum (Pt), or diamond.

FIGS. 4a~4e illustrate sectional views showing steps of a process for fabricating a lithography mask in accordance with the embodiments of the present invention.

Figure 4A:
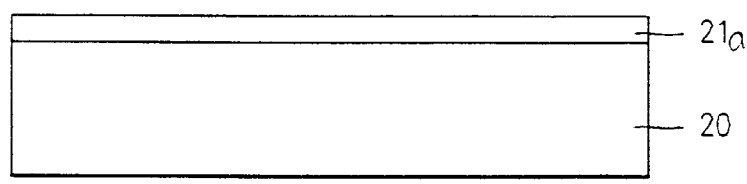
FIGS. 4a~4e illustrate sectional views showing the steps of a process for fabricating a lithography mask in accordance with the embodiments of the present invention.
Figure 4B:
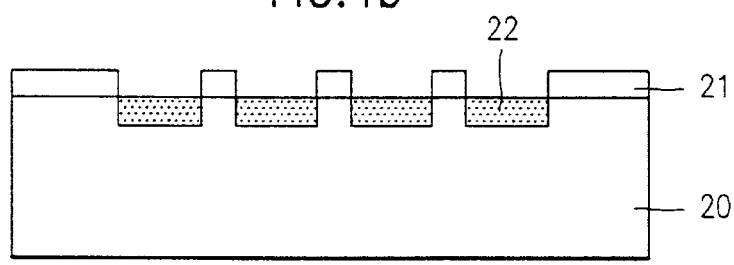

As shown in FIG. 4a, an oxide film 21a is formed on a silicon substrate 20. The silicon substrate 20 in this case has either an N conductivity type or P conductivity type. As shown in FIG. 4b, in order to form a thin film region in which a microscopic pattern is to be formed, the oxide film 21a is subjected to window patterning to form a plurality of oxide film patterns 21 spaced apart in predetermined intervals on the substrate 20. The patterning of the oxide film 21a is carried out by dry etching. A dopant having the same conductivity type as the substrate 20 is implanted into the surface portion of the substrate 20 to high concentration by using the oxide film patterns 21 as ion implanting masks. As a result, the doped regions 22 in the surface portion of the substrate 20 are formed. Each of the doped regions 22 formed in the top portion of the substrate 20 is doped to a depth of 10 μm~30 μm with a dopant selected from boron, phosphorus and arsenic.

Figure 4C:
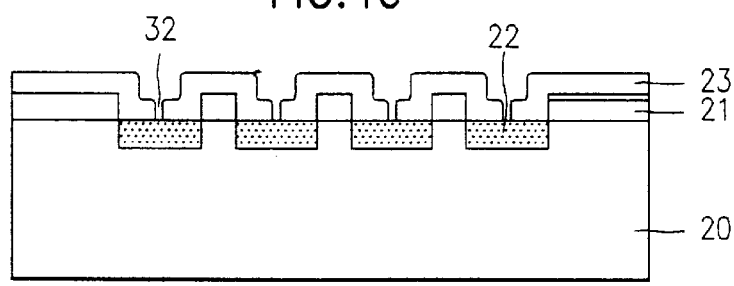

Referring to FIG. 4c, a conductive layer 23 is formed all over the oxide film patterns 21 and the doped regions 22 of the substrate 20. The conductive layer 23 is formed either of a refractory metal or diamond. The refractory metal used in this case is selected from tungsten (W), aluminum (Al) and platinum (Pt). Then the conductive layer 23, completely covering the top surfaces of doped regions 22, is patterned to form a plurality of microscopic holes 32 over the doped regions 22. The size and shape of the microscopic holes are the same or substantially the same; however, they may be varied from each other. The size of each of the microscopic patterns including the microscopic holes 32 formed in the conductive layer 23 is more than 20 times greater than the size of the actual pattern to be formed on a wafer.

Figure 4D:
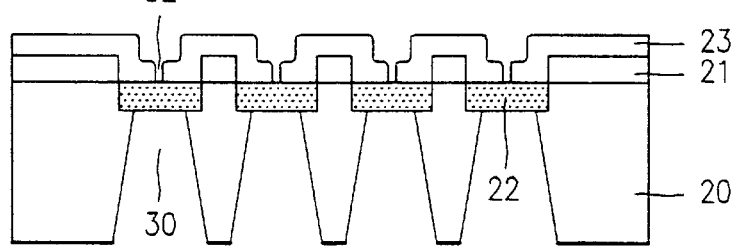

As shown in FIG. 4d, the substrate 20 is selectively etched from its back side to expose portions of the doped regions 22 and to form a plurality of trenches 30. Each trench 30 is formed so that the exposed portion of the doped region 22 exactly centers the corresponding microscopic pattern and the hole 32 formed on the doped region 22. Electro-chemical etching is used in this time for etching the back side of the substrate 20 until the doped regions 22 are exposed and for forming the trenches 30.

Figure 4E:
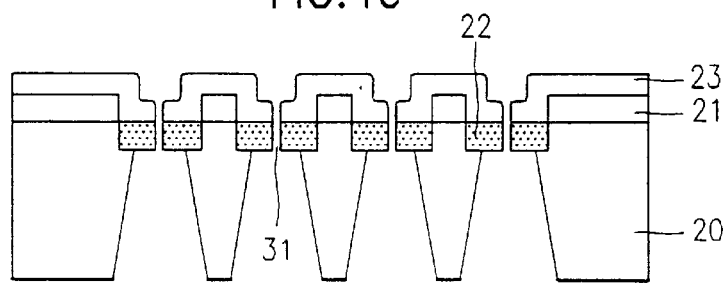

As shown in FIG. 4e, using the remaining conductive layer 23 as a mask, the doped regions 22 are subjected to anisotropic etching through the microscopic holes 32 to form a plurality of penetrating holes 31 through the doped regions 22. Dry etching is used at the doped regions 22 to form the penetrating holes 31. Accordingly, a mask for fabricating a semiconductor device is formed according to the embodiments of the present invention.

Figure 5:
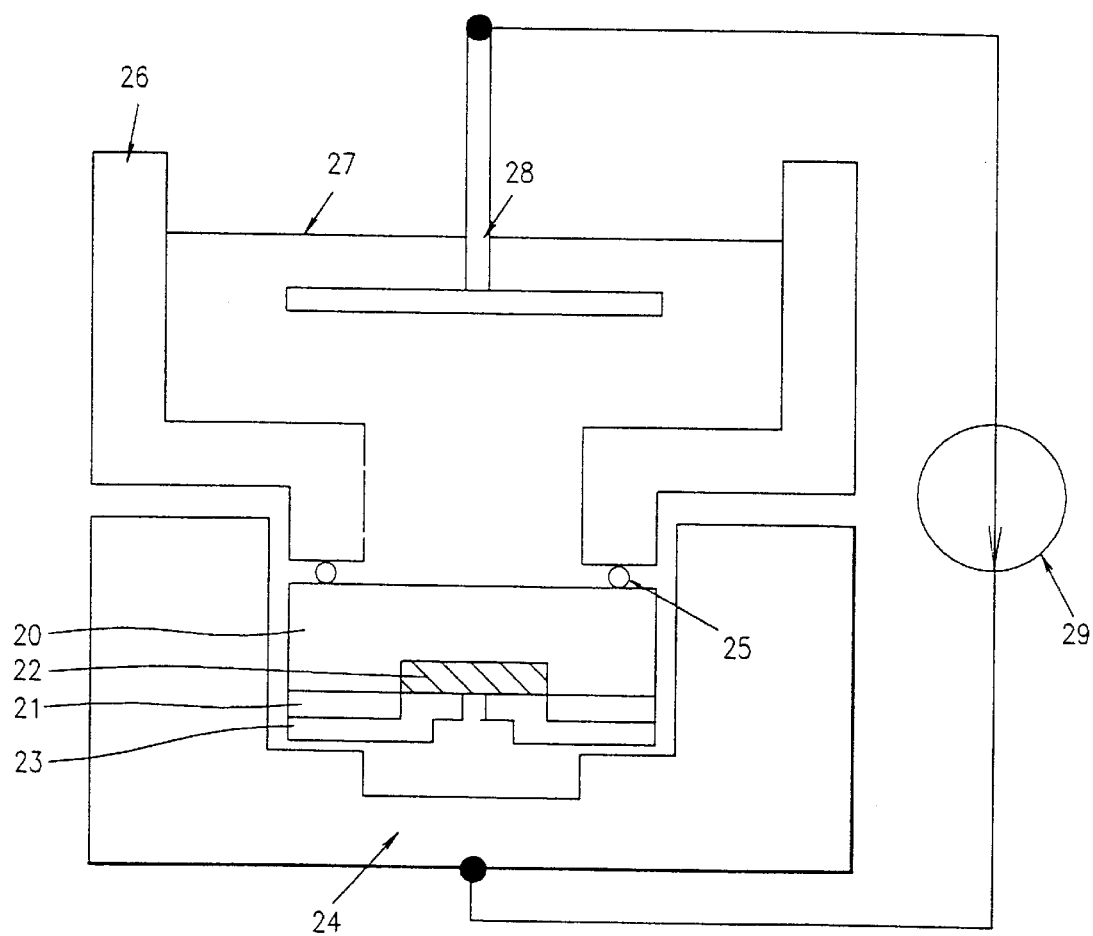
FIG. 5 illustrates a sectional view of an electrochemical etching device usable in the process for fabricating the lithography mask according to the present invention.

FIG. 5 illustrates a sectional view of an electrochemical etching device usable for etching the back side of the substrate 20. As shown in FIG. 5, the electrochemical etching device includes a copper (Cu) plate 24, an 0-ring 25, a Teflon 26, a mixed solution 27, a platinum anode 28, and a direct current power source 29.

The electrochemical etching method for etching the back side of the substrate 20, using the electro-chemical etching device of FIG. 5, will be explained.

The substrate 20 to be etched is placed on the copper plate 24. The bottom of the substrate 20 is positioned so that it contacts the mixed solution 27. The conductive layer 23 formed on the substrate 20 faces the copper plate 24. The mixed solution 27 used in this time is selected from $HF/HNO_3/H_2O$ and $HF/H_2O_2$. One electrode of the power source 29 is connected to the copper plate 24 which is in contact with the conductive layer 23 formed on the substrate 20, and the other electrode of the power source 2a is connected to the platinum anode 28 which is in contact with the mixed solution 27. Upon application of a direct current to the electrodes, the underside of the substrate 20 is etched with its etch rate controlled by the current. That is, since the current is concentrated and increased in the doped regions 22, etching is stopped when a sharp increase in this current is detected.

FIG. 6a illustrates a plan view of the completed mask having a plurality of microscopic patterns according to the present invention.

FIG. 6b illustrates a sectional view across line A–A' of FIG. 6a, and FIG. 6c illustrates an enlarged view of a microscopic pattern of FIG. 6a.

Referring to FIGS. 6a~6c, microscopic patterns are formed in a thin film region of the mask. The microscopic patterns are transcribed to the surface of the wafer by using electron beams (E-beams).

The lithography mask and the fabricating method thereof in accordance with the embodiments of the present invention have many advantages including the following.

First, mask fabrication is possible without the use of an SOI(Silicon On Insulator) wafer, which lowers the production cost.

Second, etching the back side of the silicon substrate without photolithography simplifies the process.

Third, by forming a conductive layer on the silicon substrate, the electron charging effect prevalent in the related art is reduced.

It will be apparent to those skilled in the art that various modifications and variations can be made in methods for fabricating semiconductor devices of the present invention without departing from the spirit or scope of the invention. Thus, it is intended that the present invention cover the modifications and variations of this invention provided they come within the scope of the appended claims and their equivalents.

What is claimed is:

1. A method for fabricating a mask, comprising the steps of:

forming a plurality of film patterns on a semiconductor substrate;

forming a plurality of doped regions in the semiconductor substrate;

forming a conductive layer on the doped regions and the film patterns; and forming a plurality of passages through the semiconductor substrate.

2. A method as claimed in claim 1, wherein said step of forming the plurality of doped regions includes the step of:

implanting a dopant into an upper surface of the semiconductor substrate using the film patterns as masks.

3. A method as claimed in claim 1, wherein each of the doped regions is formed between two of the film patterns.

4. A method as claimed in claim 1, wherein said step of forming the plurality of passages includes the steps of:

removing lower portions of the semiconductor substrate so as to expose portions of the doped regions, and selectively removing the exposed portions of the doped regions.

5. A method as claimed in claim 1, wherein the plurality passages are formed through the semiconductor substrate, the doped regions, and the conductive layer.

6. A method as claimed in claim 4, wherein said step of selectively removing the exposed portions of the doped regions is carried out by using anisotropic etching.

7. A method as claimed in claim 1, wherein said step of forming the conductive layer includes the steps of:

forming a conductive material over the film patterns and the doped regions, and forming a plurality of first holes through the conductive material so as to expose first predetermined portions of the doped regions and form the conductive layer.

8. A method as claimed in claim 7, wherein said step of forming the plurality of passages includes the steps of:

forming a plurality of trenches in the semiconductor substrate so as to expose second predetermined portions of the doped regions, and forming a plurality of second holes through the second predetermined portions of the doped regions.

9. A method as claimed in claim 8, wherein the second holes are formed using the conductive layer as a mask.

10. A method as claimed in claim 8, wherein the size and shape of the first holes are substantially the same as the size and shape of the second holes.

11. A method as claimed in claim 1, wherein the conductive layer substantially surrounds the film patterns.

12. A method as claimed in claim 1, wherein said step of forming the plurality of passages includes the step of:

selectively removing a lower portion of the semiconductor substrate by using electro-chemical etching, so as to expose the doped regions.

13. A method as claimed in claim 12, wherein the electrochemical etching is carried out using an electro-chemical etching device, and includes the steps of:

bringing the conductive layer into contact with a conductive plate of the electro-chemical etching device and bringing the bottom of the semiconductor substrate into contact with a mixed solution, connecting one electrode of a power source with the conductive plate and the other electrode of the power source to the mixed solution, and applying a current through the electrodes of the power source, whereby the lower portion of the semiconductor substrate is removed.

14. A method as claimed in claim 13, wherein the mixed solution is selected one from $HF/HNO_3/H_2O$ and $HF/H_2O_2$.

15. A method as claimed in claim 12, wherein the film patterns are formed by using dry etching.

16. A method as claimed in claim 1, wherein a dopant used for forming the doped regions has a conductivity type same as a conductivity type of the semiconductor substrate.

17. A method as claimed in claim 1, wherein a depth of each of the doped regions is 10 μm~30 μm.

18. A method as claimed in claim 1, wherein the conductive layer is formed of either a refractory metal or diamond.

19. A lithography mask comprising:

a semiconductor substrate;

a plurality of patterns formed on the semiconductor substrate;

a plurality of doped regions formed in the semiconductor substrate between the patterns;

a plurality of trenches formed on a lower portion of the semiconductor substrate to expose the doped regions; and a plurality of first holes each penetrating a corresponding one of the doped regions.

20. A lithography mask as claimed in claim 19, wherein the semiconductor substrate is of an N conductivity type or P conductivity type.

21. A lithography mask as claimed in claim 19, wherein the plurality of patterns are formed of an insulating film.

22. A lithography mask as claimed in claim 19, wherein each of the doped regions has a conductivity type same as a conductivity type of the semiconductor substrate.

23. A lithography mask as claimed in claim 19, wherein a depth of each of the doped regions is 10 μm~30 μm.

24. A lithography mask as claimed in claim 19, further comprising:

a conductive layer formed on the doped regions and the patterns, the conductive layer having a plurality of second holes penetrating through the conductive layer.

25. A lithography mask as claimed in claim 24, wherein the size and shape of the first holes are substantially the same as the size and shape of the second holes.

26. A lithography mask as claimed in claim 24, wherein the conductive layer substantially surrounds the plurality of patterns.

27. A lithography mask as claimed in claim 24, wherein the conductive layer is formed of either a refractory metal or diamond.

28. A lithograph mask as claimed in claim 27, wherein the refractory metal is selected from tungsten, aluminum and platinum.

29. A lithography mask as claimed in claim 19, wherein the plurality of doped regions are formed by implanting a dopant into an upper surface of the semiconductor substrate using the plurality of patterns as masks.

30. A lithography mask as claimed in claim 19, wherein the plurality of trenches are formed by using electro-chemical etching until the doped regions are exposed.

31. A lithography mask as claimed in claim 30, wherein the plurality of patterns are formed by using dry etching.

32. A lithograph mask as claimed in claim 19, wherein a dopant used to form the doped regions is one selected from boron, phosphorous and arsenic.

\* \* \* \* \*